United States Patent
Myung et al.

(10) Patent No.: US 9,608,667 B2
(45) Date of Patent: Mar. 28, 2017

(54) METHOD AND APPARATUS FOR DECODING NON-BINARY PARITY CHECK CODE

(71) Applicants: Samsung Electronics Co., Ltd., Suwon-si, Gyeonggi-do (KR); POSTECH ACADEMY-INDUSTRY FOUNDATION, Pohang-si, Gyeongsangbuk-do (KR)

(72) Inventors: Seho Myung, Seoul (KR); Kyung-Joong Kim, Pohang-si (KR); Kyeong-Cheol Yang, Pohang-si (KR)

(73) Assignees: Samsung Electronics Co., Ltd., Suwon-si (KR); Postech Academy-Industry Foundation, Pohang-si (KR)

( * ) Notice: Subject to any disclaimer, the term of this patent is extended or adjusted under 35 U.S.C. 154(b) by 52 days.

(21) Appl. No.: 14/577,033

(22) Filed: Dec. 19, 2014

(65) Prior Publication Data

US 2015/0188568 A1 Jul. 2, 2015

(30) Foreign Application Priority Data

Dec. 27, 2013 (KR) ........................ 10-2013-0164961

(51) Int. Cl.
*H03M 13/00* (2006.01)
*H03M 13/11* (2006.01)

(52) U.S. Cl.
CPC .... *H03M 13/1171* (2013.01); *H03M 13/1117* (2013.01); *H03M 13/6502* (2013.01)

(58) Field of Classification Search
CPC .......... H03M 13/1171; H03M 13/1117; H03M 13/6502
See application file for complete search history.

(56) References Cited

U.S. PATENT DOCUMENTS

2011/0029845 A1  2/2011  Zhou et al.
2013/0019141 A1* 1/2013  Wang ................ H03M 13/1117
                                                    714/763

OTHER PUBLICATIONS

Ueng et al. A High-Throughput Trellis-Based-Layered Decoding Architecture for Non-Binary LDPC Codes Using Max-Log-QSPA, Jun. 1, 2013, IEEE Transactions on Signal Processing, vol. 61, No. 11, pp. 2940-2951.*

* cited by examiner

*Primary Examiner* — Sam Rizk
(74) *Attorney, Agent, or Firm* — Jefferson IP Law, LLP

(57) ABSTRACT

A method of decoding a non-binary Low Density Parity Check (LDPC) code is provided. The method includes a plurality of messages to perform hard decision for all messages except for one message, and combines the hard-decided values with the one message that is not hard-decided, to update a final output message.

10 Claims, 5 Drawing Sheets

METHOD AND APPARATUS FOR DECODING NON-BINARY PARITY CHECK CODE

CROSS-REFERENCE TO RELATED APPLICATION(S)

This application claims the benefit under 35 U.S.C. §119(a) of a Korean patent application filed on Dec. 27, 2013 in the Korean Intellectual Property Office and assigned Serial number 10-2013-0164961, the entire disclosure of which is hereby incorporated by reference.

JOINT RESEARCH AGREEMENT

The present disclosure was made by or on behalf of the below listed parties to a joint research agreement. The joint research agreement was in effect on or before the date the present disclosure was made and the present disclosure was made as a result of activities undertaken within the scope of the joint research agreement. The parties to the joint research agreement are 1) SAMSUNG ELECTRONICS CO., LTD. and 2) POSTECH ACADEMY-INDUSTRY FOUNDATION.

TECHNICAL FIELD

The present disclosure relates to an algorithm for decreasing the decoding complexity when a non-binary code is used as a channel code, and an apparatus for decoding a channel code in a broadcasting or communication system.

BACKGROUND

Next-generation communication systems should maximize a transmission rate of the entire system and satisfy various demands of users where channel environment is continuously evolving. To this end, a channel code should have strong error correction. Accordingly, a performance standard required for channel codes has increased.

In 1962, the Low Density Parity Check (LDPC) code proposed by Gallager was demonstrated to have excellent performance similar to the Shannon's channel capacity limit through repeated decoding. However, there is a problem in that, in the case of the binary LDPC code, the length N of codes is sufficiently long in order to obtain the performance similar to the Shannon's channel capacity limit. It has been known that, when the LDPC code is designed on a non-binary finite field, the LDPC code can obtain the performance similar to the channel capacity even in a relatively short length and has an excellent performance as compared with the binary LDPC code in terms of the length of a codeword considered in an actual communication system. Further, since it has been known that the non-binary LDPC code can obtain a better performance as compared with a general binary LDPC encoding scheme even in a multiple antenna system, the non-binary LDPC code could be suitable for the next-generation communication system.

A general non-binary encoding scheme is configured to properly map one non-binary code to a signal constellation to maximize the performance. However, since a process of decoding a symbol on a non-binary finite field is more complicated than a binary code, the complexity is generally disadvantageous. Thus, in order to commercialize the non-binary LDPC code, decoding complexity should be improved.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a method and an apparatus for decoding, which efficiently restores data when data is lost and/or distorted in a broadcasting or communication system.

Another aspect of the present disclosure is to provide a method and an apparatus for decoding, which decreases the complexity without significantly influencing the decoding performance of the non-binary Low Density Parity Check (LDPC) code.

In accordance with an aspect of the present disclosure, a method of decoding a non-binary LDPC code is provided. The method includes receiving a plurality of messages and hard-deciding all messages except for one message and combining the hard-decided values with the one message that is not hard-decided, to update a final output message.

In accordance with another aspect of the present disclosure, an apparatus for decoding a non-binary LDPC code is provided. The apparatus includes a hard decision unit configured to receive a plurality of messages and hard-decide all the messages except for one message, and an output unit that combines the hard-decided values with the one message that is not hard-decided and update a final output message.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1:
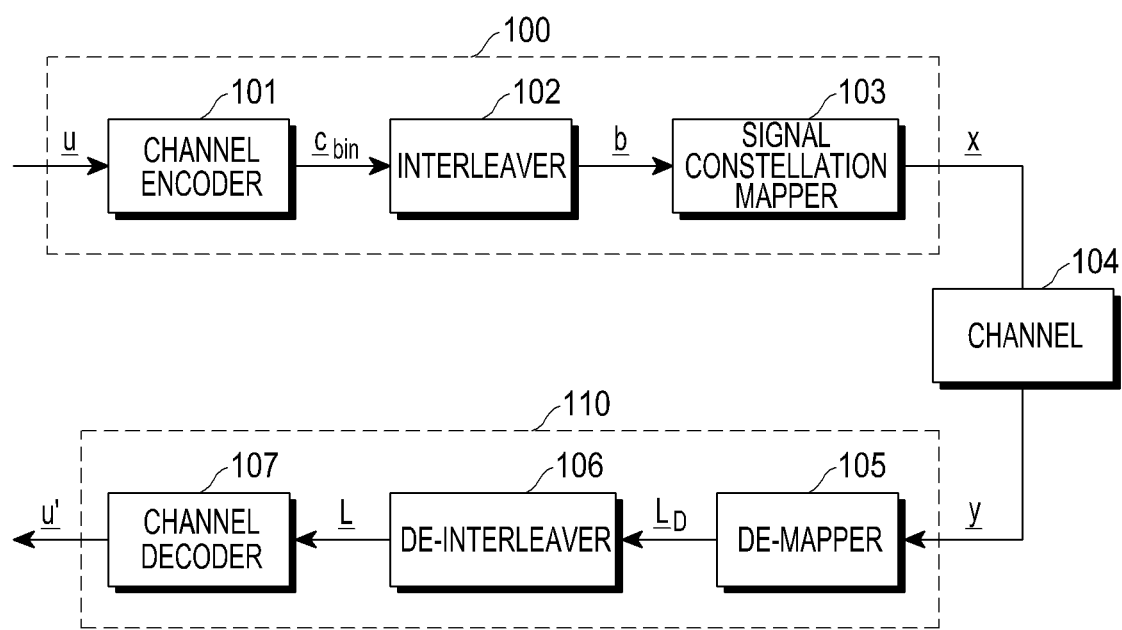
FIG. 1 illustrates a block diagram of a transmitter and a receiver according to an embodiment of the present disclosure.

The following description with reference to the accompanying drawings is provided to assist in a comprehensive understanding of various embodiment of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Embodiments of the present disclosure, which will be described below, disclose a method of restoring loss and distortion of data in all electronic devices such as a mobile phone, a TeleVision (TV), a Personal Computer (PC), an electronic board, a tablet PC, and an electronic book, which can transmit/receive various multimedia services (e.g., a video conference/call as well as high capacity contents such as High Definition (HD) contents and Ultra High Definition (UHD) contents, etc.) through the network. In particular, disclosed is a method capable of increasing the transmission efficiency without largely increasing decoding complexity in a high-order modulation scheme and a non-binary decoding scheme when the channel encoding scheme is applied to data. It is noted that, in the present specification, for the convenience of description, only non-binary parity check codes will be described, but the present disclosure is not limited to a specific non-binary coding scheme.

A parity check code is generally defined by a parity-check matrix. In the non-binary parity check code, elements constituting a parity check matrix are defined by non-binary symbols as well as 0 and 1, which is different from the binary parity check code. Here, the non-binary symbols can be represented by elements on a ring or a group and can be configured by elements on a finite field.

Although only non-binary parity check codes defined on a finite field will be disclosed in the embodiments of the present disclosure, the present disclosure is not limited to the finite field and can be also applied to a non-binary parity check code defined on a ring or a group. Further, although examples of the most well-known non-binary parity check code are the Reed-Solomon (RS) code and the non-binary LDPC code, it is noted that the present disclosure is not limited to a specific error-correcting code.

An example of a parity check matrix H formed by elements 0, 1, $\alpha$ and $\alpha^2$ on a finite field or a Galois field GF(4) is represented in Equation (1).

$$H = \begin{bmatrix} 1 & 1 & 1 & 0 & 1 & 0 & 0 \\ \alpha & \alpha^2 & 0 & 1 & 0 & 1 & 0 \\ \alpha^2 & 0 & \alpha & \alpha & 0 & 0 & 1 \end{bmatrix} \quad \text{Equation (1)}$$

When codewords of the non-binary parity check code defined by Equation (1) are defined as $\underline{c}=(c_0, c_1, c_2, c_3, c_4, c_5, c_6)$ (here, $c_n \in GF(4)$), Equation (2) is established.

$$H \cdot \underline{c} = \begin{bmatrix} c_0 + c_1 + c_2 + c_4 \\ \alpha c_0 + \alpha^2 c_1 + c_3 + c_5 \\ \alpha^2 c_0 + \alpha c_2 + \alpha c_3 + c_6 \end{bmatrix} = \begin{bmatrix} 0 \\ 0 \\ 0 \end{bmatrix} = \underline{0} \quad \text{Equation (2)}$$

Here, it should be noted that all sum calculations and all product calculations are calculations defined on the GF(4).

In Equation (2), each row of the parity check matrix H of Equation (1) corresponds to one parity check equation. In addition, it can be seen that values of each parity check equation for the codeword $\underline{c}$ becomes 0.

In general, when a parity check matrix having the size of M×N for a non-binary parity check code defined on a GF(q) is represented as H and a codeword having the length of N is represented as $\underline{c}=(c_0, c_1, \ldots, c_{N-1})$, Equation (3) is satisfied.

$$s_m = \sum_{n \in N(m)} H_{mn} c_n = 0, m = 0, 1, 2, \ldots, (M-1) \quad \text{Equation (3)}$$

Here, $s_m$ denotes a value of an $m^{th}$ parity check equation, $H_{mn}$ denotes an element at the $m^{th}$ row and the $n^{th}$ column in the parity check matrix H, and N(m) denotes a set $N(m)=\{n:H_{mn}\neq 0\}$ indicating locations of columns corresponding to elements, which is not zero, at the $m^{th}$ row in the parity check column H. Further, in Equation (3), $H_{mn}$ and the codeword symbol $c_n$ are elements of GF(q), and sum and product calculations are also calculations defined on the GF(q). For reference, an index set of a parity check equation corresponding to elements in the $n^{th}$ column is defined as $M(n)=\{m:H_{mn}\neq 0\}$.

Since a codeword of the non-binary parity check code defined in Equation (3) is configured by a non-binary symbol, when modulation is applied to the non-binary parity check code, it may be considered that the modulation has been applied such that the non-binary symbol directly corresponds to the signal constellation. However, since a unit by which information is processed in the actual communication system is a bit, a plurality of bit units corresponding to symbols, respectively, and are mapped to the signal constellation and the modulation is then applied. At this time, a symbol defined on the GF(q) can be converted into $\lceil \log_2 q \rceil$ bits with various converting schemes. For example, when the length of a codeword of the non-binary parity check code defined by Equation (3) is N and the symbol of the codeword is defined on GF(q), it can be seen that the codeword of the non-binary code can be configured using $N \cdot \lceil \log_2 q \rceil$ bits.

FIG. 1 illustrates a block diagram of a transmitter and a receiver according to an embodiment of the present disclosure.

Referring to FIG. 1, a transmission unit 100 includes a channel encoder 101, an interleaver 102, and a signal constellation mapper 103. When a non-binary channel encoding scheme is applied in the channel encoder 101, a data to which channel encoding is to be applied is converted into non-binary symbols, the channel encoder 101 generates a non-binary codeword, the interleaver 102 rearranges a sequence if necessary, and the signal constellation mapper 103 modulates the corresponding bit string for transmission through the channel 104. The interleaver 102 may be removed and may have various forms if necessary. Further, determining a signal constellation and then converting into a modulation signal through the signal constellation mapper 103 is omitted for the convenience of description.

A reception unit 110 includes a binary de-mapper 105, a de-interleaver 106 and a channel decoder 108. The de-mapper 105 calculates a probability value, a Likelihood Ratio (LR), a Log Likelihood Ratio (LLR) of a non-binary symbol, or a value corresponding thereto using a signal received from the channel 104, the de-interleaver 106 rearranges the calculated value, and the channel decoder 107 applies the de-interleaved calculated values, to obtain a non-binary codeword or a bit value corresponding thereto. The de-interleaver 106 may be removed and may have various forms if necessary.

Next, a Q-ary Sum Product Algorithm (QSPA) of a non-binary LDPC code will be described.

Figure 2:
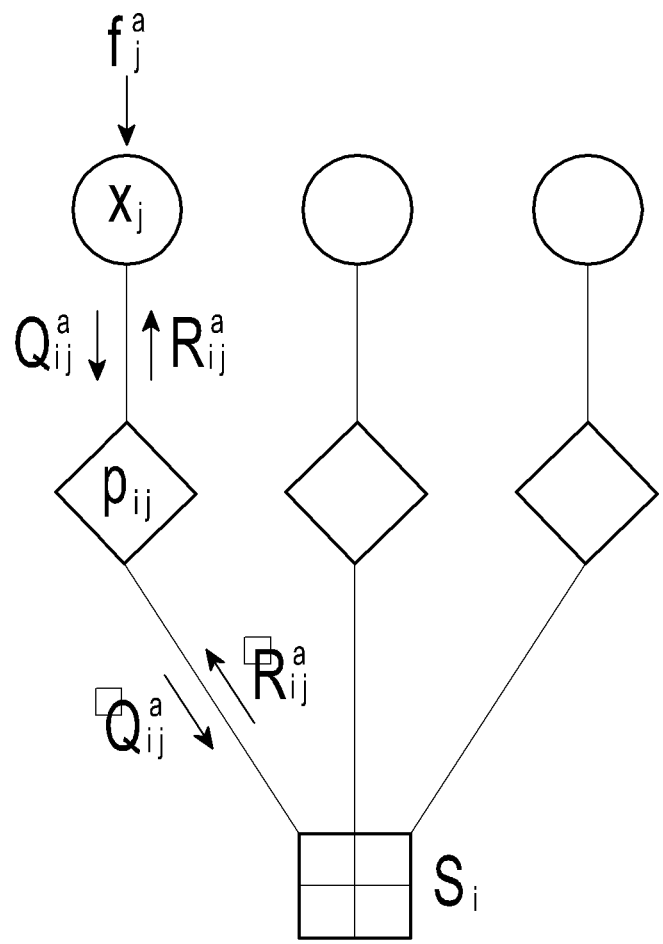
FIG. 2 illustrates an example of a factor graph of a non-binary LDPC code according to an embodiment of the present disclosure.

FIG. 2 illustrates an example of a factor graph of a non-binary LDPC code according to an embodiment of the present disclosure.

Referring to FIG. 2, $f^a_j$ is a message calculated for a decoder input based on a value received from a channel and implies a probability that $x_j$, which is a $j^{th}$ variable node ($j^{th}$ codeword symbol, i.e., a node on a factor graph corresponding to a codeword symbol corresponding to a $j^{th}$ column of a parity check matrix), is an element a on a finite field. Here, $Q_{ij}^a$ is a message transferred from a $j^{th}$ variable node via a permutation node $p_{ij}$ to a $i^{th}$ check node (node on the factor graph corresponding to an $i^{th}$ parity check equation), and $\overleftarrow{R}_{ij}^a$ is a message transferred from the $i^{th}$ check node to the $j^{th}$ variable node and implies a probability of satisfying a check equation $S_i$ when a message of $\{\overleftarrow{Q}_{ij}^a : j' \in N(i) \backslash j, a \in GF(q)\}$ is given. When passing through the permutation node $P_{ij}$ corresponding to $H_{ij}$, the messages $Q_{ij}^a$ and $\overleftarrow{R}_{ij}^a$ transmitted between the $i^{th}$ check node and the $j^{th}$ variable node are updated to messages $\overleftarrow{Q}_{ij}^a$ and $R_{ij}^a$, and $\overleftarrow{R}_{ij}^{H_{ij}a} = R_{ij}^a \overleftarrow{Q}_{ij}^{H_{ij}a} = Q_{ij}^a$ are calculated.

A proceeding process of the QSPA will be configured as follows.

Step 1: Initialization
$Q_{ij}^a$ is initialized to a message $f_j^a$ obtained from a channel.

Step 2: $\overleftarrow{R}_{ij}^a$ Updating

A message $\overleftarrow{R}_{ij}^a$ transmitted from a $i^{th}$ check node to a $j^{th}$ variable node is calculated using $$\overleftarrow{R}_{ij}^a = \sum_{X^{(i)}: x_j = a} Pr(s_i | X^{(i)}) \prod_{k \in N(i) \backslash j} \overleftarrow{Q}_{ik}^{x_k},$$

and $\overleftarrow{Q}_{ij}^{H_{ij}a} = Q_{ij}^a$ is calculate.

Here, $X^{(i)}$ implies a set of values corresponding to variable nodes connected to the $Pi^{th}$ check nodes. $Pr(s_i|X^{(i)})$ has a value of 1 when $S_1$ is satisfied with respect to a given $X_{(i)}$ and has a value of 0 when $S_i$ is not satisfied with respect to the given $X^{(i)}$.

Step 3: Permutation Step
The message transmitted from the variable node to the check node is updated as $\overleftarrow{R}_{ij}^{H_{ij}a} = R_{ij}^a$ and $\overleftarrow{Q}_{ij}^{H_{ij}a} = Q_{ij}^a$ in the permutation node $p_{ij}$.

Step 4: $Q_{ij}^a$ Updating
The message $Q_{ij}^a$ transmitted from the $j^{th}$ variable node to the $i^{th}$ check node has a message updating rule which is equal to Equation (4).

$$Q_{ij}^a = \alpha_{ij} f_j^a \prod_{k \in M(j) \backslash i} R_{kj}^a \qquad \text{Equation (4)}$$

Here, $\alpha_{ij}$ is a normalizing factor for satisfying $\Sigma_{a \in GF(q)} Q_{ij}^a = 1$. After decoding, a hard decision vector z is calculated using Equation (5).

$$z_j = \text{argmax}_{a \in GF(q)} f_j^a \prod_{k \in M(j)} R_{ij}^a \qquad \text{Equation (5)}$$

When values of all the check equation are zero, the repeated decoding terminates. Otherwise, the repeated decoding is continuously performed predetermined times.

The QSPA algorithm performed through the above procedure, which is an algorithm in which values used in a decoding process is based on floating point calculation, has a high complexity that is disadvantageous to apply in an actual system. For this reason, various decoding algorithms for decreasing the decoding complexity of a non-binary code have been known.

An example of decoding algorithm of the non-binary LDPC code for decreasing the complexity corresponds to the ISBM decoding algorithm.

A decoder of the LDPC code, which is defined on a finite field GF(q) having the size of $q=2^b$ and is represented as a parity check matrix having the size of M×N, has a purpose of finding a non-binary vector z having the length N satisfying Hz=0 when a channel output is given. $z^{(k)}$ is a hard decision vector determined in $k^{th}$ repeated decoding, and $\tilde{s}_j^{(k)}$ is defined as Equation (6) using a syndrome vector $s^{(k)} = z^{(k)} H^T$.

$$\tilde{s}_j^{(k)} = \{\tilde{s}_i = h_{i,j}^{-1} s_i : s_i \in S_j\} \qquad \text{Equation (6)}$$

Here, $S_j$ is a set of check nodes connected to a $j^{th}$ variable node. When it is assumed that all hard-decided symbols of variable nodes connected to $\tilde{s}_i$, except for $z_j$, are correct, $z_j$ and $\tilde{s}_i$ satisfy $$\tilde{s}_i = \sum_{k \in N(i)} h_{i,k} z_k = e_j + c_j + \sum_{k \in N(i) \backslash j} h_{i,k} c_k = e_j.$$

Here, $c_j$ implies a $j^{th}$ symbol of the codeword, and $e_j$ implies an error of the jth symbol. When all the hard-decided symbols of $\tilde{s}_i$, except for $z_j$, have a correct value, a newly-defined variable $\sigma_{i,j} = z_j - \tilde{s}_i$ is equal to $c_j$.

Since the ISBM decoding algorithm quantizes a message vector r that is received from a channel and uses the message vector r to perform a sum calculation and a comparing calculation, the ISBM decoding algorithm has a smaller decoding complexity compared to the QSPA or the Extended Min-Sum (EMS) algorithm. Further, $\bar{r}$ is a vector formed by components obtained by clipping both ends of each of components of the vector r and then uniformly quantizing the remaining components in $2^w - 1$ steps, and each section is expressed by w bits. A vector $\bar{r}_j = (\bar{r}_{j,0}, \bar{r}_{j,1}, \ldots, \bar{r}_{j,b-1})$ formed by a $jb^{th}$ element to a $(j+1)b-1^{th}$ element of the vector $\bar{r}$ corresponds to a $j^{th}$ symbol $c_j$ of a codeword defined on a finite field $GF(2^b)$. In order to express a correlation between an element $a_l$ on $GF(2^b)$ and the vector $\bar{r}_j$, $\varphi_{j,l}$ is defined by Equation (7).

$$\varphi_{j,i} = \sum_{t=0}^{r-1} (1-2a_{l,t})\bar{r}_{j,t} \text{ (here, } 0 \leq l < 2b) \qquad \text{Equation (7)}$$

The ISBM decoding algorithm determines a hard-decided vector $z^{(k)}$ in a $k^{th}$ repeated decoding process, and to this end, a reliability measurement vector $R_j^{(k)}$ is defined using Equation (8).

$$R_j^{(k)} = (R_{j,0}^{(k)}, \ldots, R_{j,2^b-1}^{(k)}) \qquad \text{Equation (8)}$$

$R_{j,l}^{(k)}$ denotes a reliability by which $z_j$ is hard-decided as an element $a_l$ on a finite field in a $k^{th}$ repeated decoding process, and is initialized to a multiple of vector $\phi_j = (\phi_{j,0}, \ldots, \phi_{j,2^b-1})$ using Equation (9).

$$R_j^{(0)} = \lambda \phi_j \qquad \text{Equation (9)}$$

Further, an external message $\phi_{i,j}$ transferred from a check node to a variable node is defined using the vector $\phi_j$ using Equation (10).

$$\phi_{i,j} = \min_{j' \in N(i) \setminus j} \max_l \varphi_{j',l} \qquad \text{Equation (10)}$$

$\phi_{i,j}$ is a reliability determination criterion of an external message transferred from a check node to a variable node. When all the hard-decided symbols of the variable nodes connected to $\tilde{s}_i$, except for $z_j$, are correct, $\sigma_{i,j}$ is equal to $c_i$. Thus, to determine $z_j$, an external message $\psi_j^{(k)} = (\psi_{j,0}^{(k)}, \ldots, \psi_{j,2^b-1}^{(k)})$ influencing a $j^{th}$ symbol is calculated using Equation (11).

$$\psi_{j,l}^{(k)} = \sum_{-\sigma_{i,j}^{(k)} = a_l, i \in M(j)} \phi_{i,j} \qquad \text{Equation (11)}$$

A process of the ISBM decoding algorithm will be configured as follows.

Initialization Step:

k and z are initialized to k=0 and $z=z^{(0)}$, and $z=z^{(0)}$, and a maximum repeated decoding number of times $k_{max}$ is determined. $R_j^{(0)}$ is initialized to $R_j^{(0)} = \lambda \phi_j$ with respect to $0 \leq j < N$. $\phi_{i,j}$ is calculated and stored with respect to $0 \leq i < M$, $j \in N(i)$.

Step 1:

A syndrome vector $s^{(k)}$ is calculated using $s^{(k)} = z^{(k)} H^T$. When the syndrome vector $s^{(k)}$ is a zero vector, decoding is terminated and $z^{(k)}$ is output as a codeword. Otherwise, the process proceeds to step 2.

Step 2:

When k is equal to $k_{max}$, the decoding is terminated and failure of the decoding is declared. Otherwise, the process proceeds to step 3.

Step 3:

$\psi_j^{(k)}$ is calculated with respect to $0 \leq j < N$. $R_j^{(k+1)}$ is updated using Equation (12), and then the process proceeds to step 4.

$$R_j^{(k+1)} = R_j^{(k)} + \psi_j^{(k)} \qquad \text{Equation (12)}$$

Step 4:

k increases by 1. A hard-decided vector, $z^{(k)} = (z_0^{(k)}, \ldots, z_{n-1}^{(k)})$ is calculated using Equation (13), and the process returns to step 1.

$$z_j^{(k)} = \text{argmax}_{a_l} R_{j,l}^{(k)} \qquad \text{Equation (13)}$$

The above-described ISBM decoding scheme significantly decreases the decoding complexity through the quantization, but has a disadvantage in that performance deterioration is large. Thus, an embodiment of the present disclosure proposes a method which decreases the performance deterioration while a calculation complexity of a check node is not substantially different from that of the ISBM scheme.

The embodiment of the present disclosure proposes the EISBM algorithm having a lower calculation complexity of a check node and the size of an external message transferred from a check node to a variable node is q. In an algorithm proposed in the embodiment of the present disclosure, a vector $\phi_j$ having the length q is received from $d_v-1$ variable nodes connected to the same check node to update a check node, $\phi_j$, which has been received from $d_v-2$ variable nodes, is hard-decided, and the check node is updated.

Figure 3:
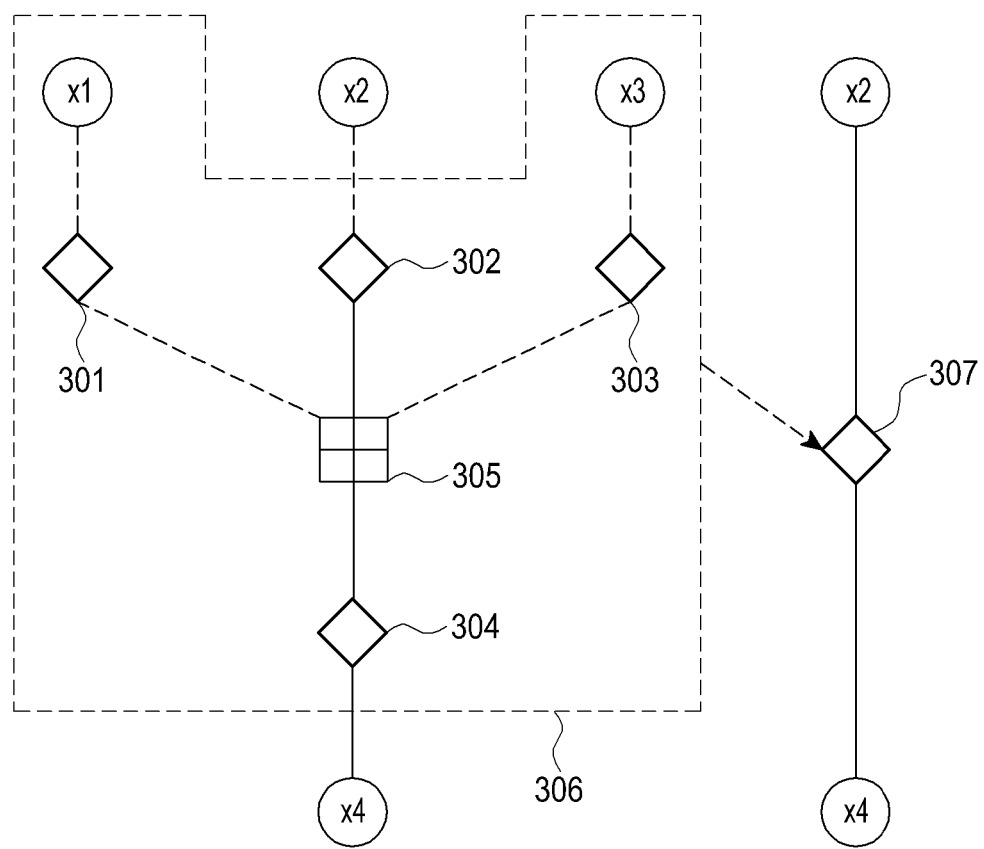
FIG. 3 illustrates that a check node and a permutation node of are approximated to a permutation node of through the Extended Iterative Soft-reliability Based Majority-logic (EISBM) decoding according to an embodiment of the present disclosure.

FIG. 3 illustrates that a check node and a permutation node of are approximated to a permutation node of through the Extended Iterative Soft-reliability Based Majority-logic (EISBM) decoding according to an embodiment of the present disclosure.

Because it can be determined that the reliability of the hard-decided symbol $z_j$ is larger as the maximum value of $\phi_{j,l}$ is larger, $d_v-2$ variable nodes having a larger maximum value of $\phi_{j,l}$ are selected from $d_v-1$ variable nodes connected to a check node and a hard-decided symbol $z_j$ is determined in symbols. For example, in FIG. 3, when it is assumed that two variable nodes having the largest maximum value of $\phi_{j,l}$ are nodes x1 and x3 connected to node 301 and 303, the nodes x1 and x3 are hard-decided to determine symbols z1 and z3.

In this way, when a symbol of each node is determined, values of the determined symbols and permutation nodes are combined as indicated by reference numeral 306 in FIG. 3 to be converted into one permutation node as indicated by reference numeral 307. For example, when FIG. 3 is defined as a code formed by symbols 0, 1, A and $A^2$ (here, $A^2 = A+1$ and $A^3 = A(A+1) = A^2 + A = 1$) on a GF(4), z1 is equal to 0, z3 is equal to A, a value of the node 301 is equal to 1, a value of a node 302 is equal to A, a value of the node 303 is equal to $A^2$, and a value of a node 304 is equal to 1, a permutation node 307 combined by a relation equation of a check node 305 can be obtained by Equation (14). Here, it is assumed that values of hard decisions for x2 and x4 are z2 and z4, respectively, and values of z1, z2, z3 and z4 is correct.

$$0 = z_1 \times (301) + x_2 \times (302) + z_3 \times (303) + x_4 \times (304) \qquad \text{Equation (14)}$$
$$= x_2 A + A^3 + x_4 = x_2 A + 1 + x_4 \Leftrightarrow x_4 = x_2 A + 1$$

That is, reference numeral 307 in FIG. 3 functions as a permutation node having a form of $\alpha x + \beta$ (in the present embodiment, $\alpha = A$, $\beta = 1$) with respect to a given input x.

Thus, the decoding algorithm of the non-binary LDPC code proposed in the present disclosure corresponds to a method which hard-decides values of messages of all variable nodes except for a value of a decoding message corresponding to one variable node that is determined to have the lowest reliability among variable nodes connected to a check node of which a message is to be updated. The disclosed method combines the hard-decided values with permutation nodes connected to the variable nodes to which the hard decision is subjected to be converted into one permutation node 307, then applies the combined permutation node to a message to which the hard decision is not subjected, thereby updating the message.

A general proceeding process of the EISBM decoding algorithm according to an embodiment of the present disclosure is configured as follows.

Initialization Step:

k and z are initialized to k=0 and z=z$^{(0)}$, and a maximum repeated decoding number of times k$_{max}$ and a weighting factor λ are determined. R$_j^{(0)}$ is initialized to R$_j^{(0)}$=λφ$_j$ with respect to 0≤j<N.

Step 1:

A syndrome vector s$^{(k)}$ is calculated using s$^{(k)}$=z$^{(k)}$H$^T$. When the syndrome vector s$^{(k)}$=0, the decoding is terminated and z$^{(k)}$ is output as a codeword. Otherwise, the process proceeds to step 2.

Step 2:

When k is equal to k$_{max}$, the decoding is terminated and a decoding failure is declared. Otherwise, the process proceeds to step 3.

Step 3:

φ$_{i,j,a}$ is determined using Equation (15) with respect to 0≤i<M, j∈N(i) and 0≤a<2$^b$.

$$\phi_{i,j,a} = \phi_{i,\alpha a+\beta} \qquad \text{Equation (15)}$$

Here, $\alpha = h_{i,l}h_{i,j}^{-1}$ and $$\beta = h_{i,j}^{-1} \sum_{\substack{t \in N(i) \\ t \neq l, t \neq j}} h_{i,t} z_t$$

Step 4:

θ$_j^{(k)}$=(θ$_{j,0}^{(k)}$, . . . , θ$_{j,2^b-1}^{(k)}$) is defined using $$\theta_{j,a}^{(k)} = \sum_{i \in M(j)} \phi_{i,j,a}.$$

R$_j^{(k+1)}$ is updated using Equation (16), and the process then proceeds to step 5.

$$R_j^{(k+1)} = R_j^{(k)} + \theta_j^{(k)} \qquad \text{Equation (16)}$$

Step 5:

k increases by 1. A hard-decided vector z$^{(k)}$=(z$_0^{(k)}$, . . . , z$_{n-1}^{(k)}$) is determined using Equation (17), and the process returns to Step 1.

$$z_j^{(k)} = \arg\max_a R_{j,l}^{(k)} \qquad \text{Equation (17)}$$

Figure 4:
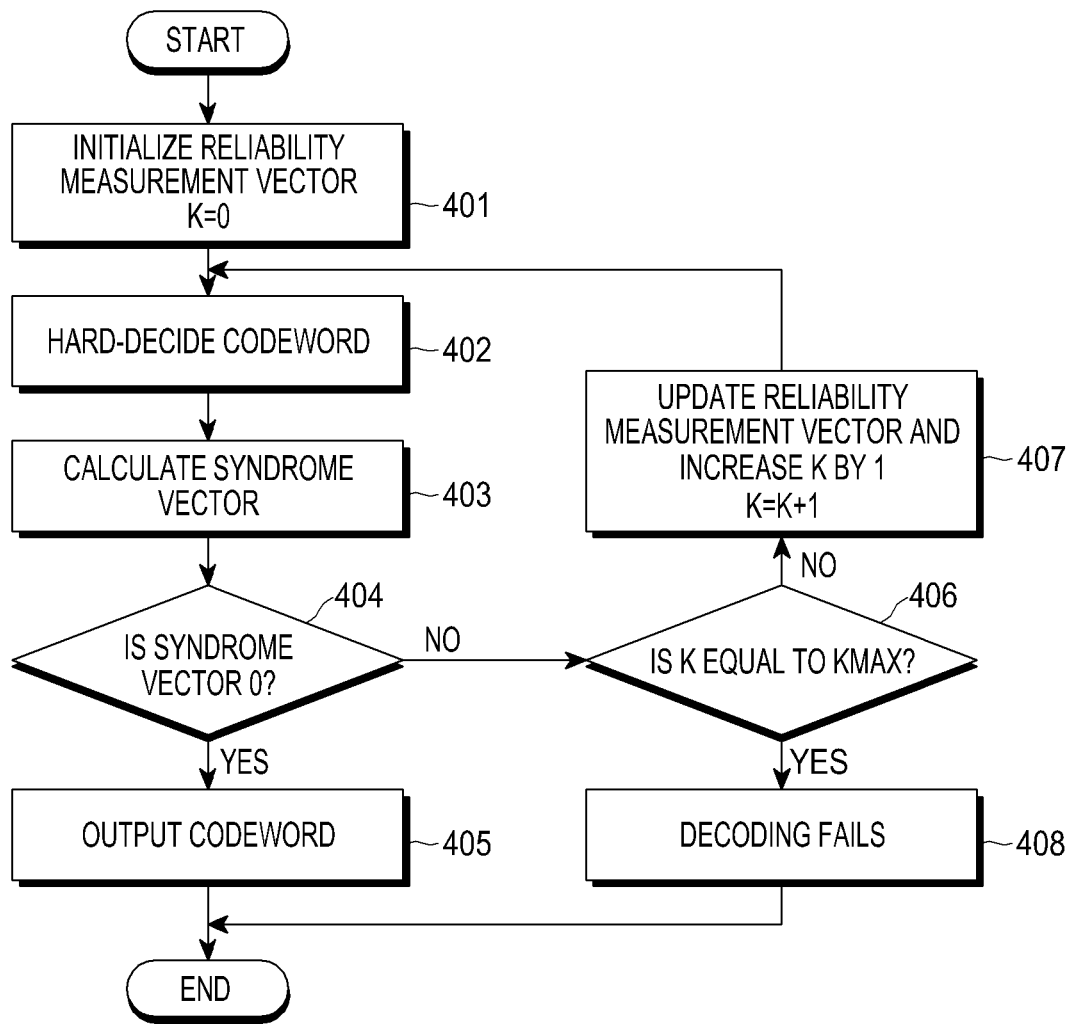
FIG. 4 is a flowchart of a decoding procedure according to an embodiment of the present disclosure.

FIG. 4 is a flowchart of a decoding procedure according to an embodiment of the present disclosure.

First, a value of a decoding counter K is initialized to 0 and a reliability measurement vector is initialized from a received signal at operation 401. Next, a codeword is hard-decided from the received signal at operation 402 and a syndrome vector is calculated from the hard-decided codeword at operation 403. It is determined whether the calculated syndrome vector coincides with a value of 0 at operation 404. When the calculated syndrome vector coincides with the value of 0, the decoding succeeds and the hard-decided codeword is output at operation 405. When the values of the syndrome vector are not 0, it is considered that the decoding does not succeed. Thus, the decoding counter K is compared with a predetermined maximum value Kmax at operation 406, and when the decoding counter K is less than the predetermined maximum value Kmax, the value K incremented by 1, and the reliability measurement vector is then updated according to a predetermined rule at operation 407. Thereafter, the codeword is hard-decided from a received signal again while reflecting the updated reliability measurement vector. Such a process can be repeated until the syndrome vector has the value of 0. However, when the values of the syndrome vector are not 0 and the decoding counter K is equal to the maximum value Kmax, a decoding failure is declared at operation 408 and all operations are terminated.

Figure 5:
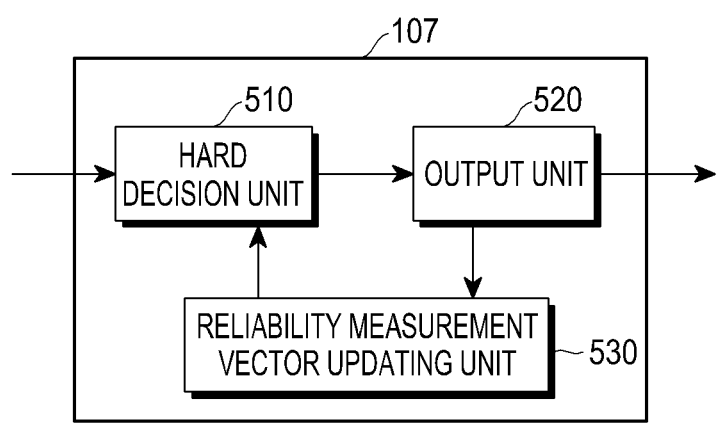
FIG. 5 is a block diagram illustrating a configuration of an apparatus for decoding according to an embodiment of the present disclosure.

FIG. 5 is a block diagram illustrating a configuration of an apparatus for decoding according to an embodiment of the present disclosure.

Referring to FIG. 5, a hard decision unit 510 initializes a value of a decoding counter K to 0, initializes a reliability measurement vector from a received signal, and hard-decides a codeword from the received signal. An output unit 520 calculates a syndrome vector from the hard-decoded codeword and identifies whether values of the calculated syndrome vector coincide with a value of 0. When the values of the syndrome vector coincide with the value of 0, the decoding succeeds and the hard-decided codeword is output as a final codeword. When the values of the syndrome vector are not 0 decoding does not succeed, the decoding counter K is compared to the predetermined maximum value Kmax to determine if decoding should continue. Specifically, if the values of the syndrome vector are not 0 and the decoding counter does not equal the predetermined maximum value Kmax, the decoding counter K is incremented by 1 and the result is transferred to a reliability measurement vector updating unit 530. The reliability measurement vector updating unit 530 updates a reliability measurement vector according to a predetermined rule and transfers the updated reliability measurement vector to the hard decision unit 510. Thereafter, the hard decision unit 510 hard-decides the codeword from a received signal again while reflecting the updated reliability measurement vector. However, when the decoding counter K is equal to the predetermined maximum value Kmax, the output unit 520 declares that the decoding fails and the decoding operations are terminated.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A method of decoding a non-binary low density parity check (LDPC) code, the method comprising:
   receiving a plurality of messages from a plurality of variable nodes connected to a check node and hard-deciding the messages except for one message from a variable node among the plurality of variable nodes; and
   combining the hard-decided values with the one message that is not hard-decided, to update a final output message.

2. The method of claim 1, wherein the one message that is not hard-decided is determined to have a lowest reliability from a previously-defined reliability measurement vector.

3. The method of claim 2, wherein the reliability measurement vector has a different value for each codeword symbol and a size of the reliability measurement vector is equal to a number of non-binary symbols of a single codeword.

4. The method of claim 2, wherein, when the codeword symbol is hard-decided, values of the reliability measurement vector have a probability value that the codeword symbol is hard-decided for each of the non-binary symbols or a value corresponding thereto.

5. The method of claim 2, wherein, when decoding fails, the reliability measurement vector is updated according to a predetermined rule until a decoding counter reaches a predetermined maximum value, and the hard decision is performed again.

6. An apparatus for decoding a non-binary low density parity check (LDPC) code, the apparatus comprising:
   a hard decision unit configured to receive a plurality of messages from a plurality of variable nodes connected to a check node and hard-decide the messages except for one message from a variable node among the plurality of variable nodes; and
   an output unit configured to combine the hard-decided values with the one message that is not hard-decided and update a final output message.

7. The apparatus of claim 6, wherein the hard decision unit is further configured to determine that the one message that is not hard-decided has a lowest reliability from a previously-defined reliability measurement vector.

8. The apparatus of claim 7, wherein the reliability measurement vector has a different value for each codeword symbol and a size of the reliability measurement vector is equal to a number of non-binary symbols of a single codeword.

9. The apparatus of claim 7, wherein, when the codeword symbol is hard-decided, values of the reliability measurement vector have a probability value that the codeword symbol is hard-decided for each of the non-binary symbols or a value corresponding thereto.

10. The apparatus of claim 7, further comprising a reliability measurement vector updating unit configured to:
    update, when decoding fails, the reliability measurement vector according to a predetermined rule until a decoding counter reaches a predetermined maximum value,
    wherein the hard decision unit is further configured to perform the hard decision on the basis of the updated reliability measurement vector.

* * * * *